United States Patent
Ohno et al.

(10) Patent No.: US 6,673,654 B2
(45) Date of Patent: Jan. 6, 2004

(54) METHOD OF MANUFACTURING SEMICONDUCTOR DEVICE USING HEATED CONVEYANCE MEMBER

(75) Inventors: Takao Ohno, Kawasaki (JP); Koichi Meguro, Kawasaki (JP); Shigeru Kamada, Kawasaki (JP); Keisuke Fukuda, Kawasaki (JP); Yuzo Shimobeppu, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/087,910
(22) Filed: Mar. 5, 2002

(65) Prior Publication Data
US 2003/0077879 A1 Apr. 24, 2003

(30) Foreign Application Priority Data
Oct. 23, 2001 (JP) .......................... 2001-325107

(51) Int. Cl.[7] .................. H01L 21/44; H01L 21/48
(52) U.S. Cl. ................. 438/118; 438/114; 257/753; 257/783
(58) Field of Search ................. 438/455–465, 438/113–118; 257/753, 782, 783

(56) References Cited

U.S. PATENT DOCUMENTS 5,637,395 A * 6/1997 Uemura et al. ............. 428/343
6,159,827 A * 12/2000 Kataoka et al. ............. 438/464

FOREIGN PATENT DOCUMENTS

JP 11-168131 6/1999
JP 200-269137 9/2000

* cited by examiner

Primary Examiner—Caridad Everhart
Assistant Examiner—Calvin Lee
(74) Attorney, Agent, or Firm—Westerman, Hattori, Daniels & Adrian, LLP

(57) ABSTRACT

A semiconductor device is manufactured by an integrated circuit forming process, and a series of subsequent steps. In the series of steps, a protection tape 18 is adhered onto a first surface of a semiconductor substrate on which a plurality of semiconductor elements are formed, and the second surface of the semiconductor substrate is ground so that the semiconductor substrate has a desired thickness, the semiconductor substrate is then conveyed while controlling the temperature of the semiconductor substrate. The semiconductor substrate is then separated into a plurality of semiconductor elements. The occurrence of warping on the semiconductor substrate during conveyance of the semiconductor substrate is thus prevented.

3 Claims, 6 Drawing Sheets

PRIOR ART

METHOD OF MANUFACTURING SEMICONDUCTOR DEVICE USING HEATED CONVEYANCE MEMBER

BACKGROUND OF THE INVENTION

1. Field of the Invention

The present invention relates to a method of manufacturing a semiconductor device.

2. Description of the Related Art

Conventionally, a semiconductor device is manufactured in such a manner that, for example, a plurality of semiconductor elements are formed on the first surface of a silicon wafer (semiconductor substrate), and the silicon wafer is subjected to dicing so as to separate the semiconductor elements (silicon chips) from each other. Between the step of forming semiconductor elements on the silicon wafer and the step of dicing, there is a step of grinding the silicon wafer so that the thickness of the separated silicon chips can be reduced to a desired value. When the silicon wafer is ground, a protection tape is adhered to one surface of the silicon wafer and then the opposite surface of the silicon wafer is ground by a grinding wheel.

After the completion of grinding the silicon wafer, the protection tape which is adhered onto the silicon wafer is irradiated with ultraviolet light so as to reduce the adhesive property, and the protection tape with reduced adhesive property is peeled off from the silicon wafer. At the same time, the silicon wafer is attached onto a dicing tape. In the above steps, the silicon wafer is attracted and conveyed by a vacuum suction device.

Recently, there has been an increasing demand for reducing the thickness of the silicon wafer and the silicon chip. However, as the thickness of the silicon wafer is reduced, a problem arises in which the silicon wafer is warped. Especially if the surface of the silicon wafer, which is opposite to the surface on which the semiconductor elements are formed, is ground while the protection tape is adhered onto the silicon wafer, the silicon wafer tends to warp badly. When the silicon wafer is warped, it becomes difficult to handle the silicon wafer after that and further it becomes difficult to convey the silicon wafer.

SUMMARY OF THE INVENTION

An object of the present invention is to provide a method of manufacturing a semiconductor device capable of being conveyed without occurrence of warping on a semiconductor substrate even if the thickness of the semiconductor substrate is reduced.

A method of manufacturing a semiconductor device, according to the present invention, comprises the steps of adhering a protection tape onto a first surface of a semiconductor substrate having a first surface having a plurality of semiconductor elements formed therein and a second surface opposite to the first surface, grinding the second surface of the semiconductor substrate, conveying the semiconductor substrate while controlling the temperature of the semiconductor substrate to prevent occurrence of warping, and separating the semiconductor substrate into the plurality of semiconductor elements.

In this arrangement, the semiconductor substrate, onto one surface of which the protection tape is adhered, and the opposite surface of which is ground, is conveyed to a next step while controlling (raising, for example), the temperature of the semiconductor substrate. There is a tendency that the semiconductor substrate is usually warped to the side onto which the protection tape is adhered, but when the protection tape is thermally expanded, the semiconductor substrate can be prevented from being warped onto the side on which the protection tape is adhered. In this way, the semiconductor substrate can be conveyed under the condition that no warping is caused on the semiconductor substrate.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

The embodiment of the present invention will now be explained with reference to the drawings. Referring to FIGS. 9A to 9F, a typical example of a series of steps of a method of manufacturing a semiconductor device will be explained.

Figure 9A:
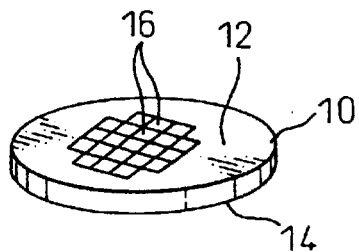
FIGS. 9A to 9F are views illustrating a typical example of a series of steps of a method of manufacturing a semiconductor device.

FIG. 9A is a view showing a silicon wafer (a semiconductor substrate) which is subjected to an integrated circuit forming process. The silicon wafer 10 has a first surface 12 and a second surface 14. A plurality of semiconductor elements 16 have been formed on the first surface 12 of the silicon wafer 10 during the integrated circuit forming process. The semiconductor elements 16 are portions to be separated into silicon chips by subsequent dicing, as described later.

Figure 9B:
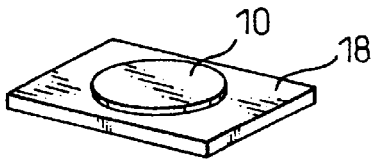

In FIG. 9B, a protection tape 18 is adhered onto the first surface 12 of the silicon wafer 10 on which the semiconductor elements 16 are formed. The protection tape 18 is cut to a profile which matches the shape of the silicon wafer 10.

Figure 9C:
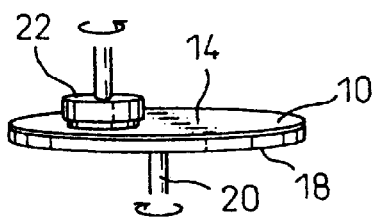

In FIG. 9C, the second surface 14 of the silicon wafer 10 is ground, while the protection tape 18 is adhered onto the first surface 12 of the silicon wafer 10. In this example, a diamond grinding wheel 22, which is a mechanical processing tool, grinds the second surface 14 of the silicon wafer 10 in a state that a rotary supporting member 20 supports the protection tape 18 of the silicon wafer 10. During the grinding, the first surface 12 of the silicon wafer 10 on which the semiconductor elements 16 are formed is protected by the protection tape 18.

It is necessary for the silicon wafer 10 to have a certain level of thickness in the integrated circuit forming process, so the silicon wafer 10 has a thickness greater than a desired value. As shown in FIG. 9C, the silicon wafer 10 is ground to a desired thickness, with the protection tape 18 adhered to the silicon wafer 10, after the integrated circuit forming process.

Figure 9D:
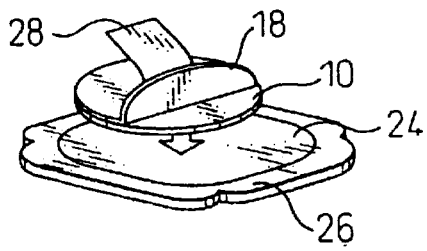

In FIG. 9D, after the silicon wafer 10 is ground to have a desired thickness, the second surface 14 of the silicon wafer 10 is adhered onto a dicing tape 24 and the protection tape 18 is peeled off from the first surface 12 of the silicon wafer 10. The dicing tape 24 is adhered to a wafer ring 26, and the protection tape 18 is removed, using a double-sided adhesive tape 28, for example. Before the protection tape 18 is peeled off, the protection tape 18 is irradiated with ultraviolet light.

Figure 9E:
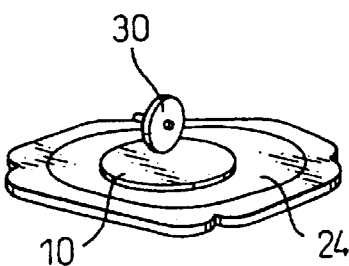

In FIG. 9E, the silicon wafer 10 is diced and separated into a plurality of semiconductor elements (silicon chips) 16 by a dicer 30, in a state that the silicon wafer 10 is adhered to the dicing tape 24. The separated semiconductor elements (silicon chips) 16 are still adhered onto the dicing tape 24.

Figure 9F:
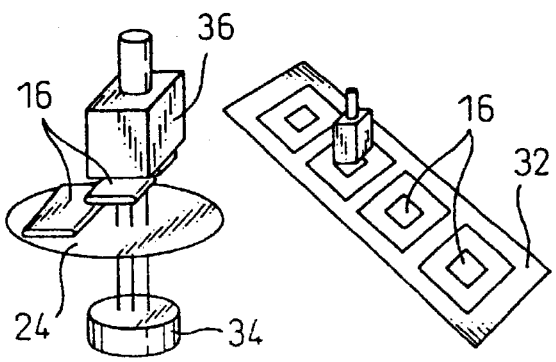

In FIG. 9F, the separated semiconductor elements (silicon chips) 16 are die-bonded to a lead frame 32. In this case, each semiconductor element (silicon chip) 16 is peeled off from the dicing tape 24 by a needle device 34, and conveyed onto the lead frame 32 by a suction head 36.

Figure 10:
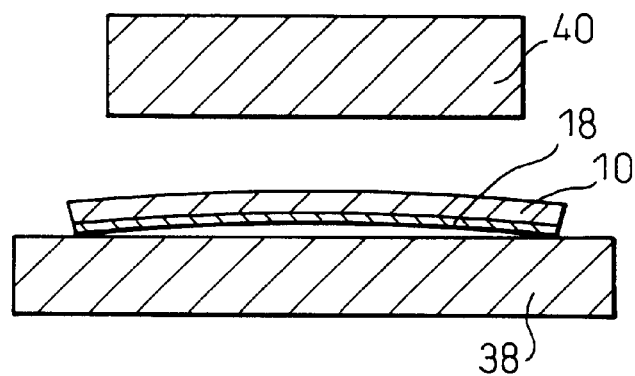
FIG. 10 is a view showing a warped silicon wafer.

FIG. 10 is a view showing a warped silicon wafer 10. The thickness of the silicon wafer 10 before grinding shown in FIG. 9C is 200 μm, for example, but the thickness of the silicon wafer 10 after grinding shown in FIG. 9C is decreased to a value not more than 100 μm. If the thickness of the silicon wafer 10 is decreased, warping might occur on the silicon wafer 10. When the protection tape 18 is adhered onto the silicon wafer 10, the silicon wafer 10 receives stress from the protection tape 18, and warping can occur easily.

In FIG. 10, the silicon wafer 10 is attracted and supported by a vacuum suction head 38 which is a portion for the rotary support member 20 shown in FIG. 9C. After the grinding operation is completed, the silicon wafer 10 is released from the vacuum suction head 38 and attracted and supported by a vacuum suction head 40 which is a portion of a conveyance device. In order to prevent the silicon wafer 10 from being warped, the vacuum suction head 40 is pressed against the silicon wafer 10 and the silicon wafer 10 is attracted to the vacuum suction head 40 while the vacuum suction head 38 is attracting the silicon wafer 10, and the attracting operation of the vacuum suction head 38 is then stopped.

By doing so, the silicon wafer 10 can be conveyed by the conveyance device including the vacuum suction head 40, without causing warping on the silicon wafer 10. However, according to this method, there is a possibility that the silicon wafer 10 is warped while it is being conveyed, resulting in an incomplete handling operation, and an increase in stress applied to the silicon wafer 10. Further, when the vacuum suction head 40 releases the silicon wafer 10 after that, the silicon wafer 10 may be warped.

Figure 11:
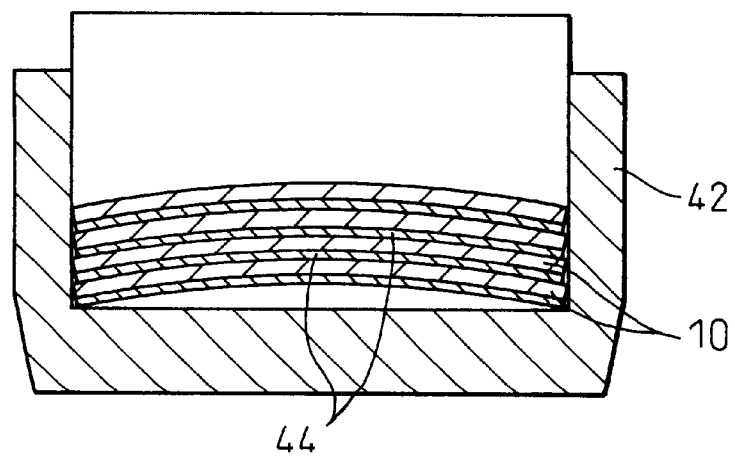
FIG. 11 is a view showing a carrier accommodating a plurality of warped silicon wafers.

FIG. 11 is a view showing a carrier (or case) 42 for accommodating a plurality of silicon wafers 10. The silicon wafers 10 are put into the carrier 42 after they are released from the vacuum suction head 40 shown in FIG. 10. When the vacuum suction head 40 releases the silicon wafer 10, the silicon wafer 10 is warped. Therefore, it becomes difficult to attract the silicon wafer 10 in the next process step.

Accordingly, it is desired that the silicon wafer 10 is not warped even if the thickness of the silicon wafers 10 is reduced.

Figure 1:
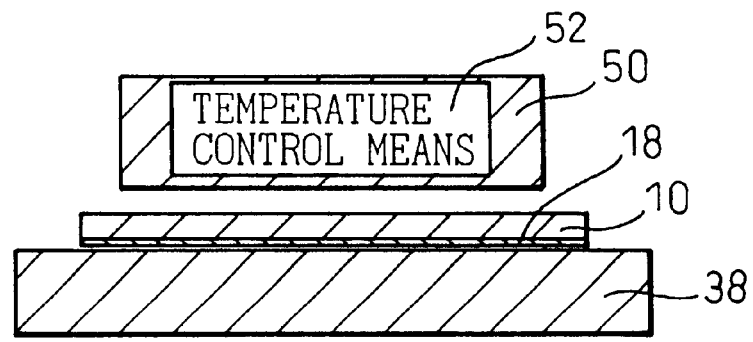
FIG. 1 is a view illustrating the step of conveying a silicon wafer, after the step of grinding the silicon wafer, in a series of steps of manufacturing a semiconductor device, of the present invention.

FIG. 1 is a view for illustrating the step of conveying the silicon wafer 10 after the step of grinding the silicon wafer 10, which is one of a series of steps of manufacturing a semiconductor device of the present invention. This conveyance step corresponds to the conveyance step after the grinding step shown in FIG. 9C, in a series of steps of the method of manufacturing a semiconductor device shown in FIGS. 9A to 9F.

In FIG. 1, the silicon wafer 10 is attracted and supported by the vacuum suction head 38 which is a portion of the rotary support member 20 shown in FIG. 9C, in a manner similar to that shown in FIG. 10. After the grinding is completed, the silicon wafer 10 is released from the vacuum suction head 38 and attracted and supported by a vacuum suction head 50 which is a portion of the conveyance device.

The vacuum suction head 50 has a temperature control means 52. The temperature control means 52 comprises a heater, the heating temperature of which is controllable. An occurrence of warping on the silicon wafer 10 can be prevented, by heating the silicon wafer 10 with the protection tape 18 adhered thereto by the heater. The protection tape 18 is thermally expanded more than the silicon wafer 10. The silicon wafer 10 usually tends to be warped to the side to which the protection tape 18 is adhered but when the protection tape 18 is thermally expanded, the silicon wafer 10 is prevented from being warped to the side to which the protection tape 18 is adhered.

As the temperature control means 52 is incorporated in the vacuum suction head 50, no warping is caused on the silicon wafer 10 during the conveyance of the silicon wafer 10 by the conveyance means including the vacuum suction head 50. It is preferable that the silicon wafer 10 is not only simply heated but is heated to a predetermined temperature. The predetermined temperature is decided according to the thickness of the silicon wafer 10 and the type of the protection tape 18.

For example, in the case where the thickness of the silicon wafer 10 is smaller than 100 μm and the protection tape 18 is made of polyester or a polyester based material, the silicon wafer 10 is prevented from being warped when the temperature is set in the range from 35 to 60° C. In this case, for example, it is possible to use the protection tape 18 made of PET manufactured by Lyntec, the thickness of which is 100 μm. In the case where the thickness of the silicon wafer 10 is 100 to 300 μm and the protection tape 18 is made of polyolefin or a polyolefin based material, the silicon wafer 10 can be prevented from being warped when the temperature is set in the range from 35 to 60° C. In this case, for example, it is possible to use a protection tape 18 made of PO and manufactured by Furukawa Denko, the thickness of which is 200 μm. In this way, no warp is caused on the silicon wafer 10, it becomes possible to normally convey the silicon wafer 10.

Figure 2:
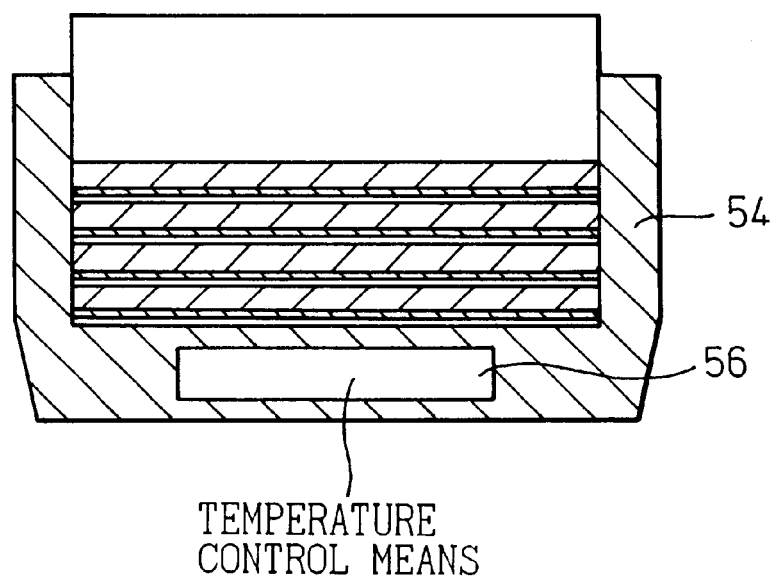
FIG. 2 is a view showing a carrier in which a plurality of silicon wafers are accommodated.

FIG. 2 is a view showing a carrier (case) 54 in which a plurality of silicon wafers 10 are accommodated. The silicon wafers 10 are conveyed into the carrier 54 which is conveyed by the conveyance means including the vacuum suction head 50 shown in FIG. 1. The silicon wafers 10 are accommodated in the carrier 54 in a state that no warping occurs on the silicon wafers.

The carrier 54 has a temperature control means 56. The temperature control means 56 comprises a heater the heating temperature of which is controllable, in a manner similar to that of the temperature control means 52. Accordingly, the silicon wafer 10 can be kept in the carrier 54 without warping. The carrier 54 is made of stainless steel. However, any material can be used for the carrier 54 as long as it has a heat resistance to approximately 80° C.

Figure 3:
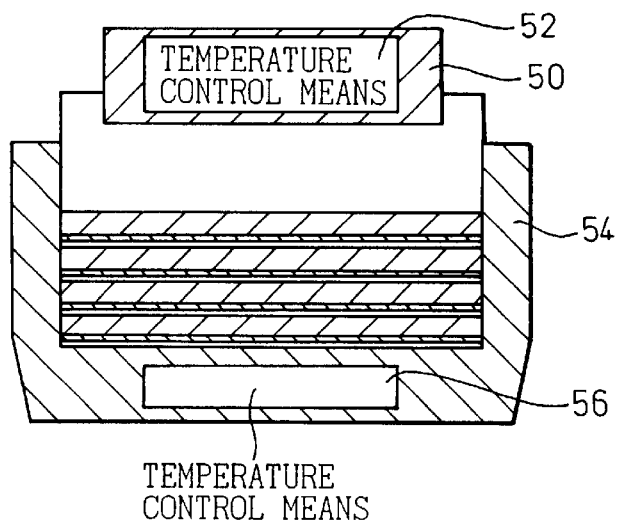
FIG. 3 is a view showing the carrier shown in FIG. 2 from which silicon wafers are being taken out.

FIG. 3 is a view showing the state in which the silicon wafers 10 are taken out from the carrier 54 shown in FIG. 2. Also, in this case, the silicon wafers 10 are taken out from the carrier 54 by the conveyance means including the vacuum suction head 50 having the temperature control means 52 shown in FIG. 1. Therefore, the silicon wafers 10 can be conveyed without warping.

Figure 4:
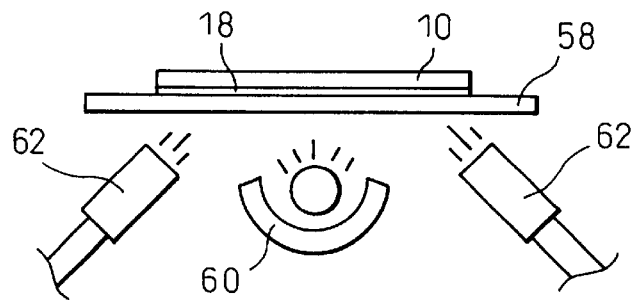
FIG. 4 is a view illustrating the step of irradiating an ultraviolet light onto the silicon wafer.
Figure 4:
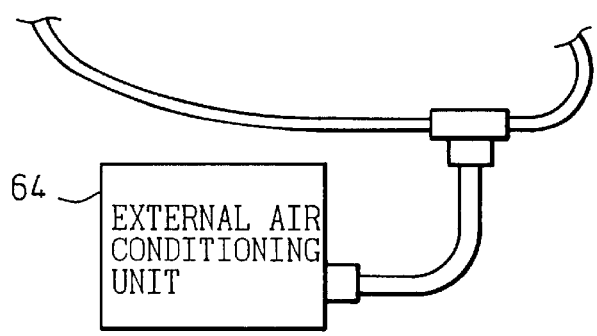

FIG. 4 is a view illustrating the step of irradiating ultraviolet light onto the silicon wafer 10. The silicon wafer 10 is taken out of the carrier 54 by the conveyance means including the vacuum suction head 50 having the temperature control means 52 and conveyed to the ultraviolet light irradiating step. The silicon wafer 10 is put on a glass plate 58 and irradiated with ultraviolet light by an ultraviolet light lamp 60. Paste component in the protection tape 18 is cured by the irradiation of ultraviolet light so that the protection tape 18 can be easily peeled off. After that, as shown in FIG. 9D, the protection tape 18 is peeled off from the silicon wafer 10.

In FIG. 4, the temperature of the silicon wafer 10 is raised by the irradiation of ultraviolet light, so that the silicon wafer 10 tends to be warped. Therefore, in order to prevent the silicon wafer 10 from being warped, a current of air, the temperature of which is controlled, is blown out from nozzles 62, so that the temperature of the silicon wafer 10 can be kept in the range from 35 to 60° C. and the occurrence of warping can be prevented. The nozzles 62 are connected to an external temperature control unit 64.

Figure 5:
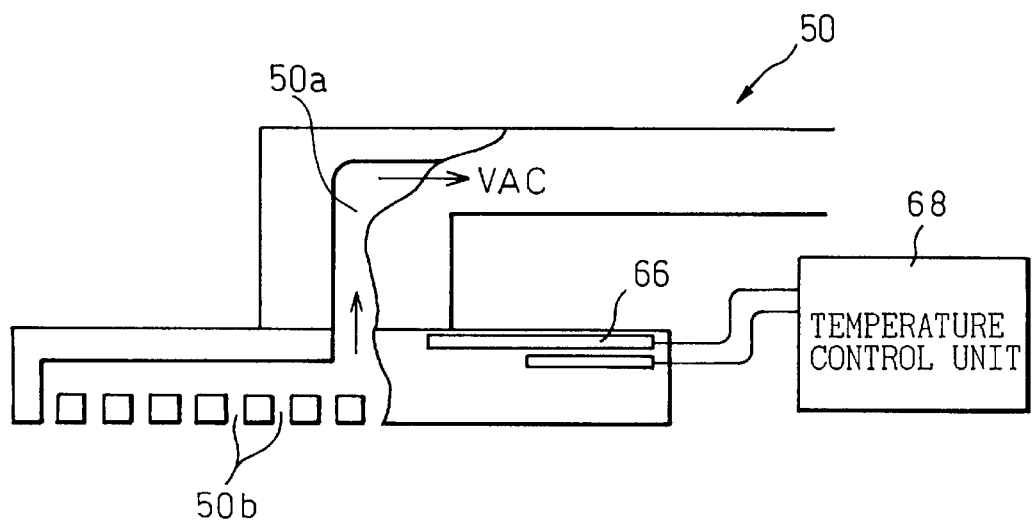
FIG. 5 is a view showing an example of a vacuum suction head having a temperature control means.

FIG. 5 is a view showing an example of the vacuum suction head 50 having a temperature control means 52. The vacuum suction head 50 includes a fluid passage 50a and suction grooves 50b. Air is exhausted as shown by arrows, and the silicon wafer 10 is attracted by the vacuum suction head 50. The vacuum suction head 50 incorporates a heater 66 therein, and a temperature control unit 68 is connected to the heater 66. The temperature control unit 68 controls the heater 66 so that the temperature of the silicon wafer 10 can be in the range from 35 to 60° C. The heater 66 and the temperature control unit 68 constitute the temperature control means 52. The temperature control unit 68 comprises a switch means such as a thermo-couple.

Figure 6:
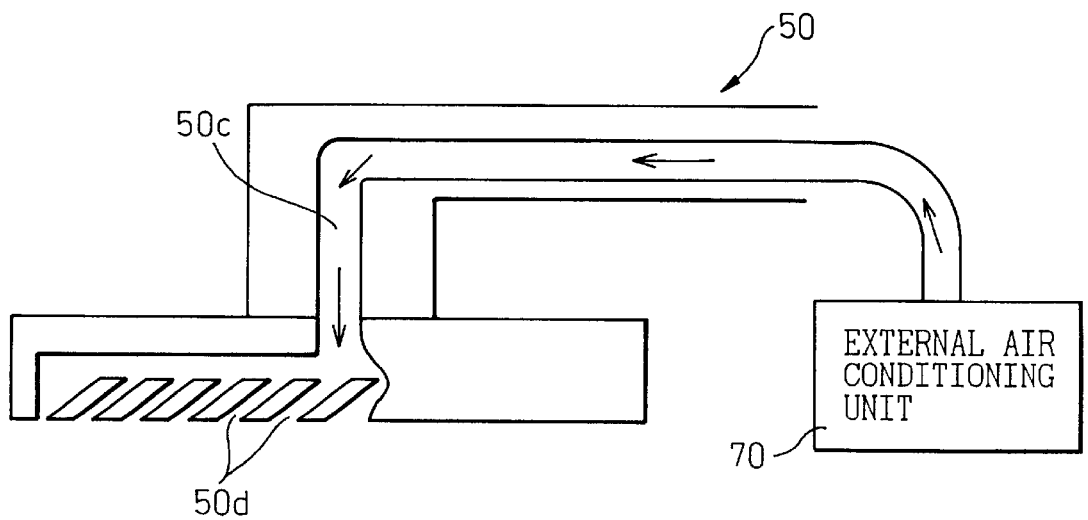
FIG. 6 is a view showing an example of a vacuum suction head having a temperature control means.

FIG. 6 is a view showing an example of the vacuum suction head 50 having a temperature control means 52. The vacuum suction head 50 includes a fluid passage 50c and suction grooves 50d. Air is supplied as shown by arrows. The silicon wafer 10 is arranged so that a minute gap is formed between the silicon wafer 10 and the vacuum suction head 50, whereby the silicon wafer 10 is attracted to the vacuum suction head 50 by a Bernoulli force. The fluid passages 50c are connected to an external temperature control unit 70, so that a current of air, the temperature of which is controlled, is supplied to the vacuum suction head 50. The fluid passage 50c and the external temperature control unit 70 constitute the temperature control means 52.

Figure 7:
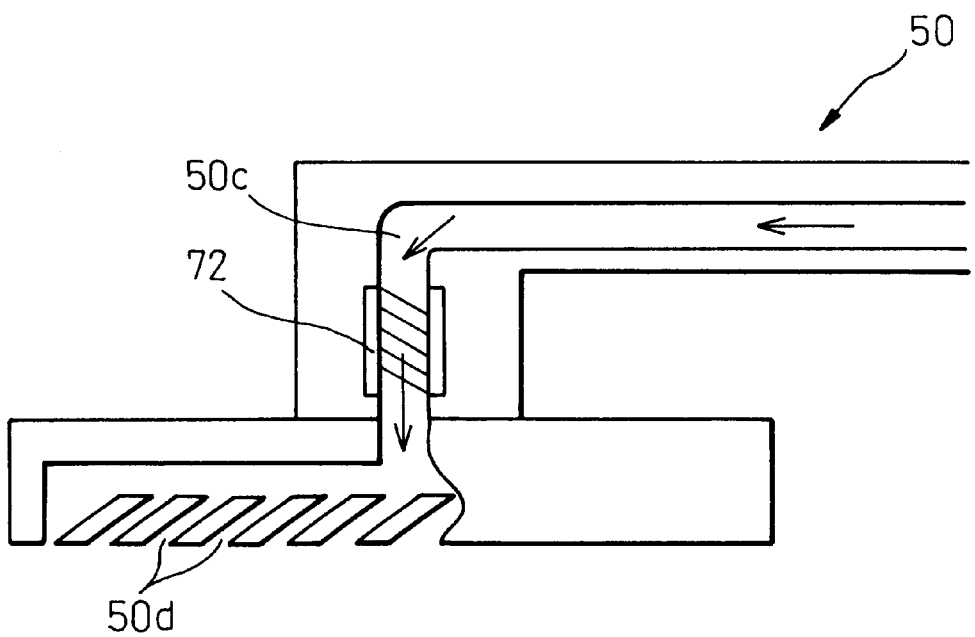
FIG. 7 is a view showing an example of a vacuum suction head having a temperature control means.

FIG. 7 is a view showing an example of the vacuum suction head 50 having a temperature control means 52. The vacuum suction head 50 includes a fluid passage 50c and a suction grooves 50d. Air is supplied as shown by arrows. The silicon wafer 10 is arranged so that a minute gap is formed between the silicon wafer 10 and the vacuum suction head 50, whereby the silicon wafer 10 is attracted to the vacuum suction head 50 by the Bernoulli force. The heater 72 is arranged in the fluid passage 50c and controls the temperature of air flowing in the fluid passages 50c to within a predetermined temperature range. The fluid passage 50c and the heater 72 constitute the temperature control means 52.

Figure 8:
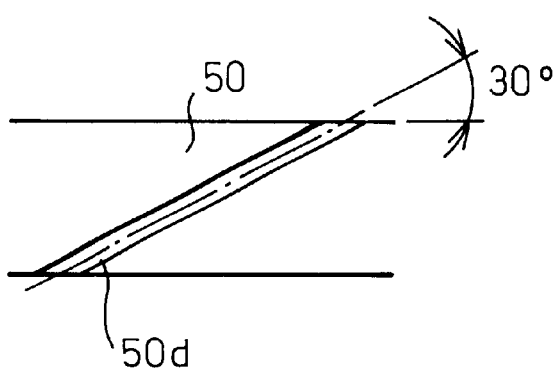
FIG. 8 is a view showing a suction groove shown in FIGS. 6 and 7, in detail.

FIG. 8 is a view showing the suction groove 50d shown in FIGS. 6 and 7 in detail. When the suction groove 50d of the vacuum suction head 50 is arranged forming an angle of 30° with respect to the head surface, the silicon wafer 10 can be securely attracted to the vacuum suction head 50 by the Bernoulli force without the silicon wafer 10 contacting the vacuum suction head 50.

As described above, according to the present invention, it is possible to provide a method of manufacturing a semiconductor device capable of being conveyed, without warping, on a semiconductor substrate.

What is claimed is:

1. A method of manufacturing a semiconductor device comprising the steps of:

adhering a protection tape onto a first surface of a semiconductor substrate having said first surface having a plurality of semiconductor elements formed therein and a second surface opposite to said the first surface;

grinding said second surface of said semiconductor substrate;

conveying said semiconductor substrate while controlling the temperature of said semiconductor substrate to prevent the occurrence of warping; wherein said semiconductor substrate is conveyed into a carrier capable of accommodating a plurality of semiconductor substrates and having a temperature control device; and separating said semiconductor substrate into a plurality of semiconductor elements.

2. The method of manufacturing a semiconductor device according to claim 1 wherein, in the step of conveying the semiconductor substrate, said semiconductor substrate is supported by a suction chuck having a temperature control device.

3. The method of manufacturing a semiconductor device according to claim 1, further comprising the steps of:

irradiating ultraviolet light onto said protection tape; and peeling said protection tape off from said first surface of said semiconductor substrate;

wherein, in the step of irradiating ultraviolet light onto the protection tape, an ultraviolet light source and a temperature control device are used.

* * * * *